United States Patent [19]

Smithers

[11] Patent Number: 5,276,585
[45] Date of Patent: Jan. 4, 1994

[54] HEAT SINK MOUNTING APPARATUS
[75] Inventor: Matthew C. Smithers, Lewisville, Tex.
[73] Assignee: Thermalloy, Inc., Dallas, Tex.
[21] Appl. No.: 977,220
[22] Filed: Nov. 16, 1992
[51] Int. Cl.$^5$ .............................................. H05K 7/20
[52] U.S. Cl. .................................. 361/704; 165/80.3; 165/185; 174/16.3; 257/712; 257/718; 257/719; 361/690; 361/709; 361/702
[58] Field of Search .............................. 165/80.3, 185; 174/16.3; 361/383-; 259/712, 718, 719

[56] References Cited

U.S. PATENT DOCUMENTS

| 4,660,123 | 4/1987 | Hermann | 361/386 |
| 4,679,118 | 7/1987 | Johnson et al. | 361/386 |
| 4,745,456 | 5/1988 | Clemens | 361/386 |

FOREIGN PATENT DOCUMENTS 0266225  3/1989  Fed. Rep. of Germany ...... 361/386

OTHER PUBLICATIONS

IERC "High Speed Microprocessor Heat Dissipators", Bulletin No. 503, Mar. 1991, pp. 1-2.

*Primary Examiner*—Gregory D. Thompson
*Attorney, Agent, or Firm*—Jack A. Kanz

[57] ABSTRACT

A clip having parallel edge frames with pockets at each end and connected by transverse beams is used to removeably secure a heat sink to an orthogonal device package by inserting the corners of the device package in the pockets to secure the heat sink between the transverse beams and the surface of the device package.

10 Claims, 1 Drawing Sheet

HEAT SINK MOUNTING APPARATUS

This invention relates generally to assembly of electronic components. More particularly, it relates to assembly apparatus for removeably securing heat sinks in thermal communication with electronic device packages without using tools, adhesives, loose parts or the like.

BACKGROUND OF THE INVENTION

Many semiconductor devices generate heat which must be dissipated to avoid damage to the device and/or impairment of its operating characteristics. In some devices, the heat generated is sufficiently dissipated by the enclosure, header or leads. Sometimes the device package is mounted on heat sinks including bodies of thermally conductive materials such as, for example, copper and aluminum which dissipate the heat generated by the semiconductor device into the surrounding environment. Such heat sinks may have extruded, machined or formed sheet metal bodies with dissipating fins and the like for conducting heat from the electronic device and dissipating heat into the surrounding environment.

Advances in microelectronics technology tend to develop device chips which occupy less physical space while performing more functions. Conventionally, the chips are packaged in housings which protect the chip from its environment and provide means for input/output communication between the chip and external circuitry. Miniaturization thus results in generation of more heat in less space with less physical structure for removing the heat from the electronic device package. Furthermore, as device packages decrease in size and are adapted for surface mounting on a circuit board or the like, attachment of heat sinks to the device package is further complicated not only by miniaturization of the package itself, but the requirement that heat sinks be secured to the package without causing damage to or electrical shorting between terminal leads extending from the package. Of course, as the size of the package decreases, the number and fragility of terminal leads increases. The size and shape of the heat sink used in connection with any specific electronic device package will vary, of course, with the configuration of the device package, the thermal dissipation requirements and the environment into which the thermal energy must be dissipated.

SUMMARY OF THE INVENTION

In accordance With the present invention, a unitary mounting apparatus is provided for securing a flat face of a heat sink body adjacent one major face of a generally orthogonal device package which has opposed major faces and intersecting edge surfaces which define edges and corners. The mounting apparatus has a pair of edge frames defining pockets which engage adjacent corners of the device package. The edge frames are connected by at least one transverse bar which is preferably curved to provide a spring member interconnecting the edge frames. The assembly is secured together by placing a flat face of the heat sink adjacent a major face of the device package and securing the corners of the device package within the pockets with the transverse bars positioned between fins on the opposite side of the heat sink. Since the pockets only engage the corners of the device package, interference with mounting and shorting between terminal leads is avoided. Since the transverse bars are curved springs, the heat sink is removeably secured to the device package without use of any tools and remains securely attached and urged into thermal contact with the flat major face of the device package. The assembly thus avoids use of loose parts, adhesives and assembly tools. Other features and advantages of the invention will become more readily understood from the following detailed description taken in connection with the appended claims and attached drawing in which:

DESCRIPTION OF THE PREFERRED EMBODIMENT

Figure 1:
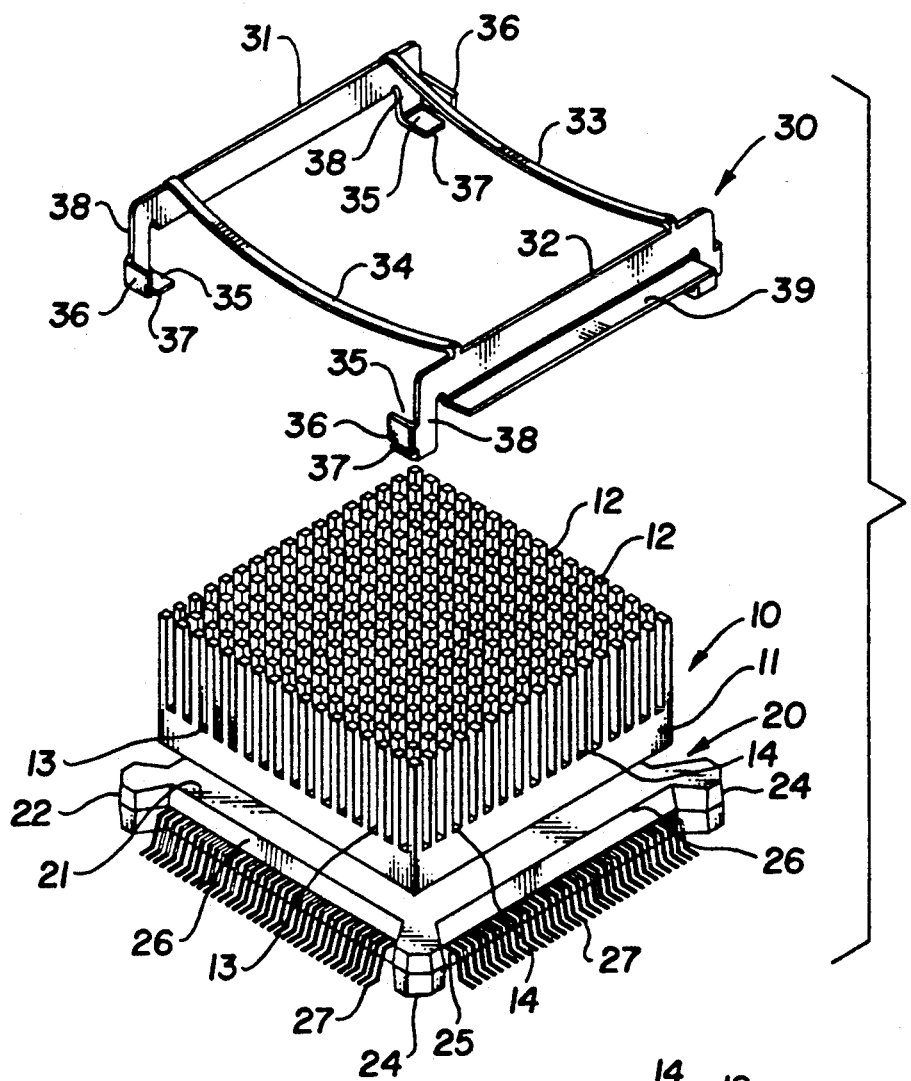
FIG. 1 is an exploded view illustrating the assembly of a pin fin heat sink on an electronic device package in accordance with one embodiment of the invention.

Assembly of a heat sink on an electronic device package in accordance with the invention is illustrated in FIG. 1 wherein a pin fin heat sink 10 is secured to a bumpered quad flatpack package 20 with a unitary mounting clip 30. In the embodiment illustrated, the heat sink 10 comprises a rectangular body 11 having opposed major faces with an array of pins 12 extending from one of the surfaces. The pins 12, as illustrated in FIG. 1, are arranged in parallel rows and evenly distributed so that they define channels 13 and 14 extending across one face of the body in intersecting planes. It will be readily recognized that a heat sink having parallel elongated fins (rather that pins) which define parallel channels; heat sinks with flat surfaces; and heat sinks with mere parallel channels may be substituted for the pin fin heat sink 10 and attached to the device package 20 using unitary clip 30 without departing from the principles of the invention.

In the embodiment illustrated clip 30 comprises first elongated edge frame 31 and second elongated edge frame 32 extending parallel with each other and connected by parallel transverse connecting beams 33, 34. In the preferred embodiment connecting beams 33, 34 are thin enough to fit within grooves 14. While two beams 33, 34 are illustrated, the clip may contain one, two or more connecting beams, depending on the configuration, size, etc., of the assembly and the material of the clip 30.

Each end of each edge frame 31, 32 defines a pocket 35 adapted to accept a corner of the electronic device package 20 when the edge frame 30 is positioned adjacent and substantially parallel with one edge of the package 20. In the embodiment illustrated, pocket 35 is formed by an outer flange 36 and a bottom flange 37, both extending from a support member 38 which depends from an end of the edge frame.

Figures 2, 3:
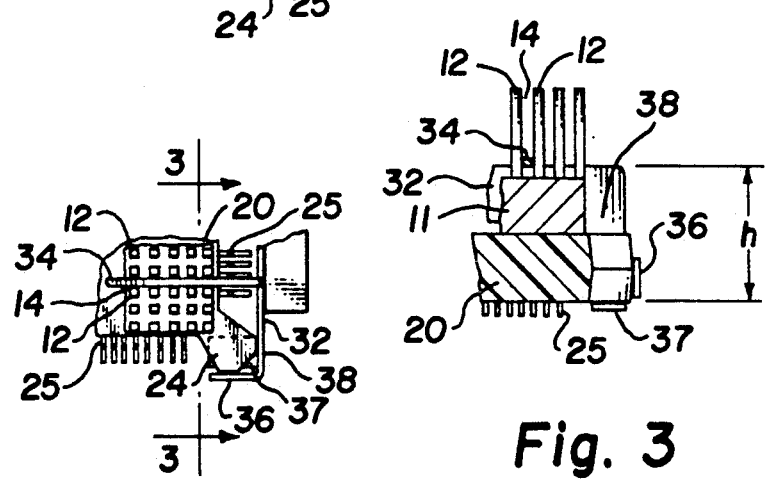
FIG. 2 is a fragmentary top plan view of a corner portion of the assembly of FIG. 1.
FIG. 3 is a sectional view of the corner portion of FIG. 2 taken along line 3—3.

As illustrated in FIG. 3, the internal distance (indicated as "h") between the plane of the ends of the connecting beams 33, 34 and the internal surface of flange 37 defining the bottom of the pocket 30 should substantially equal the combined thickness of the heat sink body 11 and the device package 20 to which it is to be attached. Accordingly, the heat sink 10 is secured to the device package 20 as illustrated in FIG. 1 by positioning the heat sink on the top flat surface 21 of the device package and fitting the pockets 35 on edge frame 31 over the corners defined by adjacent corners 22 along one edge of the device package 20. The transverse bars 33, 34 are nested in channels 14. Since transverse bars 33, 34 are curved, the opposite edge frame 32 is suspended above the opposite edge of the heat sink and corner bumpers 24. In order to secure the heat sink 10 to the package 20, pockets 35 on edge frame 32 must be forced over corner bumpers 24 by bending the curved transverse beams 33, 34. Once in position, the resilience of the spring force provided by curved beams 33, 34 distributes pressure on all four pockets 35 and beams 33, 34 thus urging the heat sink 10 into intimate contact with the top flat surface 21 of package 20. Beams 33, 34 are attached at their ends to edge frames 31, 32 and position the edge frames 31, 32 in a plane substantially parallel with but spaced from the plane of the beams 33, 34. The edge frames 31, 32 are thus positioned substantially parallel with and adjacent the sides 26 of the package 20 and the edges of the heat sink body 11. If desired, one or both edge frames may include an outwardly projecting tab 39 for use as an aid in manually assembling the structure. It will be readily recognized that tab 39 may also be used to force pockets 35 outwardly to release the clip and disassemble the structure.

In the assembly illustrated a pin fin heat sink is secured to a bumpered quad flatpack which has a generally orthogonal body with opposed major faces and intersecting edge surfaces which define edges and corners. Terminal leads project outwardly from all four sides 26. The leads are bent downwardly and outwardly to form feet 27. The feet 27 are aligned in a plane parallel with the bottom surface of the package to permit surface mounting of the device package.

Because terminal leads 25 are fragile and feet 27 must be aligned essentially coplanar to permit surface mounting of the device package, the package 20 includes bumpers 22, 24 extending from its corners to protect the leads 25 from physical damage during assembly, testing and handling. Bumpers 22, 24 are mere extensions of the body of the device package 20 and primarily serve the purpose of protecting the leads 25 during handling. However, the bumpers 22, 24 provide a convenient means for securing the unitary mounting clip 30. As illustrated, the bumpers 22, 24 nest in pockets 35 and position the edge frames 31, 32 so that they avoid contact with terminal leads 25 and do not interfere with normal surface mounting of the device package.

It should be understood that although the invention is disclosed in connection with the assembly of a pin fin heat sink on a bumpered quad flatpack package, other packages and heat sinks may also be used. For example, the clip 30 may be appropriately designed so that pockets 35 attach securely to the corners of a pin grid array without interfering with mounting of the device package or shorting of leads. Similarly, an unbumpered quad flatpack or other surface mount device may be utilized in connection with the assembly described so long as the pockets 35 are appropriately designed to secure the clip 30 to the package 20 without contacting any leads or interfering with mounting of the device package. Accordingly, it is to be understood that although the invention has been described with particular reference to specific embodiments thereof, the form of the invention shown and described in detail is to be taken as a preferred embodiment thereof. Various changes and modifications may be resorted to without departing from the spirit and scope of the invention as defined by the appended claims.

What is claimed is:

1. Apparatus for mounting a heat sink having at least one substantially flat major face and an oppositely disposed surface on an electronic device package comprising a substantially orthogonal body with first and second oppositely disposed major faces and intersecting edge surfaces which define corners comprising:
   (a) a first edge frame comprising an elongated member having first and second end portions, each end portion having a pocket defined by at least two sides and a bottom adapted to receive a corner of the electronic device package when said elongated member is positioned adjacent and substantially parallel with one edge of the package;
   (b) a second edge frame comprising an elongated member having first and second end portions, each end portion having a pocket defined by at least two sides and a bottom adapted to receive a corner of the electronic device package when said second frame member is positioned adjacent and substantially parallel with an opposite edge of the package; and
   (c) at least one beam interconnecting said first edge frame and said second edge frame and maintaining said edge frames substantially parallel with each other.

2. Apparatus as defined in claim 1 wherein said at least one beam is an axially elongated member connected to said edge frames by end portions which position said edge frames in a first plane spaced from but substantially parallel with the plane of said at least one beam.

3. Apparatus as defined in claim 2 wherein said at least one beam is curved with its central portion projecting toward said first plane.

4. Apparatus as defined in claim 1 including a tab projecting from at least one of the edge frames in a direction away from the other edge frame.

5. In combination:
   (a) a heat sink comprising a unitary body having a substantially flat first major face and an oppositely disposed second major face with a plurality of fins extending from said second major face;
   (b) a device package comprising a generally orthogonal body with first and second oppositely disposed major faces and side edges connecting said first and said second major faces and cooperating therewith to define substantially diagonally opposed corners; and
   (c) a unitary clip securing said substantially flat first major face of said heat sink adjacent said first major face of said device package comprising:
      (i) pockets defined by at least two sides and a bottom adapted to mate with said corners of said device package and contact a portion of the second major face of said device package at said corners; and
      (ii) at least one beam interconnecting at least two of said pockets and extending across said oppositely disposed second major face of said heat sink between said fins.

6. The combination defined in claim 5 wherein said device package includes bumpers extending from the corners thereof and said pockets mate with said bumpers.

7. The combination defined in claim 5 wherein said pockets are supported on opposite ends of two elongated edge frames extending substantially parallel with each other and connected by said at least one beam.

8. The combination defined in claim 7 including a tab projecting from at least one of the edge frames in a direction away from the other edge frame.

9. The combination defined in claim 7 wherein said at least one beam is a curved spring which urges the heat sink into contact with the device package.

10. The combination defined in claim 5 wherein said fins comprise a plurality of axially elongated pins arranged in parallel rows.

* * * * *

UNITED STATES PATENT AND TRADEMARK OFFICE
CERTIFICATE OF CORRECTION

PATENT NO. : 5,276,585

DATED : January 4, 1994

INVENTOR(S) : Matthew C. Smithers

It is certified that error appears in the above-identified patent and that said Letters Patent is hereby corrected as shown below:

Column 1, line 52, change "With" to ---with---

Signed and Sealed this

Seventeenth Day of May, 1994

Attest:

BRUCE LEHMAN

*Attesting Officer*     *Commissioner of Patents and Trademarks*